United States Patent [19]

Culican et al.

[11] Patent Number: 4,774,559
[45] Date of Patent: Sep. 27, 1988

[54] INTEGRATED CIRCUIT CHIP STRUCTURE WIRING AND CIRCUITRY FOR DRIVING HIGHLY CAPACITIVE ON CHIP WIRING NETS

[75] Inventors: Edward F. Culican, Hyde Park; Philip E. Pritzlaff, Jr., Wappingers Falls, both of N.Y.

[73] Assignee: International Business Machines Corporation, Armonk, N.Y.

[21] Appl. No.: 677,618

[22] Filed: Dec. 3, 1984

[51] Int. Cl.[4] .................. H01L 27/10; H01L 27/15; H01L 27/02

[52] U.S. Cl. ........................... 357/45; 357/51; 357/68; 357/71; 307/267; 307/270; 307/456; 307/457; 307/465; 307/466

[58] Field of Search .............. 307/270, 465, 466, 456, 307/457, 267; 357/45, 51, 71, 68

[56] References Cited

U.S. PATENT DOCUMENTS

| | | | |
|---|---|---|---|
| 3,488,564 | 1/1970 | Crafts | 317/235 |
| 3,513,365 | 5/1970 | Levi | 317/235 |
| 3,534,236 | 10/1970 | Bean et al. | 317/235 |
| 3,555,294 | 10/1973 | Treadway | 307/456 |
| 3,562,547 | 2/1971 | Brode | 307/202 |
| 3,610,951 | 10/1971 | Howland | 307/221 |
| 3,631,309 | 12/1971 | Myers | 317/235 |
| 3,656,004 | 4/1972 | Kemerer | 307/246 |
| 3,909,636 | 9/1975 | Masaki et al. | 357/43 |
| 4,000,429 | 12/1976 | Yoshida et al. | 307/246 |
| 4,200,811 | 4/1980 | Balaban et al. | 307/225 |
| 4,249,193 | 2/1981 | Balyoz et al. | 357/40 |
| 4,278,897 | 7/1981 | Ohno et al. | 357/45 |
| 4,295,149 | 10/1981 | Balyoz et al. | 357/45 |
| 4,417,159 | 11/1983 | Dorler et al. | 307/270 |
| 4,489,417 | 12/1984 | Askin et al. | 307/270 |
| 4,499,484 | 2/1985 | Tanizawa et al. | 357/45 |
| 4,584,653 | 4/1986 | Chih et al. | 357/40 |

OTHER PUBLICATIONS

"Use of Emitter in an Unused Transistor as an Underpass", by D. S. Hershman, IBM Technical Disclosure Bulletin, vol. 14, No. 4, Sep. 1971, p. 1207.

"Integrated Delay Circuit", by H. Heimeier, E. Klink & F. Wernicke, IBM Technical Disclosure Bulletin, vol. 21, No. 2, Jul. 1978, pp. 656–657.

"I.C.S. for Temperature Sensing and Control", by J. A. Morrison, Integrated Circuits, vol. II, No. 20, Oct. 1978.

Primary Examiner—J. Carroll
Assistant Examiner—Ngan Van Ngo
Attorney, Agent, or Firm—William T. Ellis

[57] ABSTRACT

The disclosure is directed to integrated circuit chips and particularly to "gate array", or "master slices" whereon one or more circuits drive a highly capacitive on chip wiring net. The driving circuits are modified and a compensation circuit coupled to the highly capacitive on chip wiring net to mitigate the burden caused by the high capacitance. The integrated circuit structure also contains efficiently positioned on each chip a number of compensation circuits which are readily connectable during the fabrication of the chip. The employment of one, or a number of, on chip compensation circuits does not materially increase the chip power consumption.

8 Claims, 7 Drawing Sheets

KNOWN CIRCUIT

KNOWN CIRCUIT

KNOWN CIRCUIT

FIG. 1D KNOWN CIRCUIT

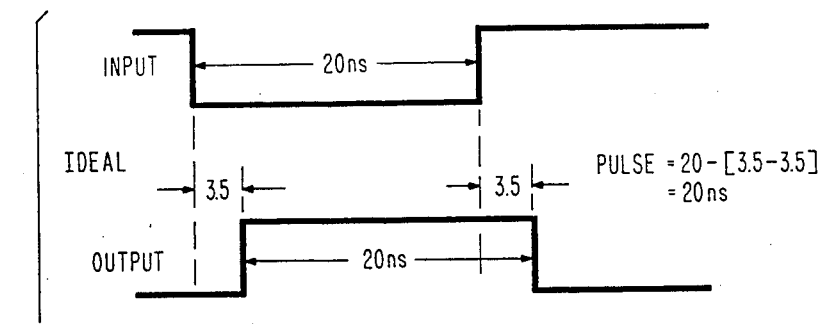
WAVEFORMS A
FIG. 4
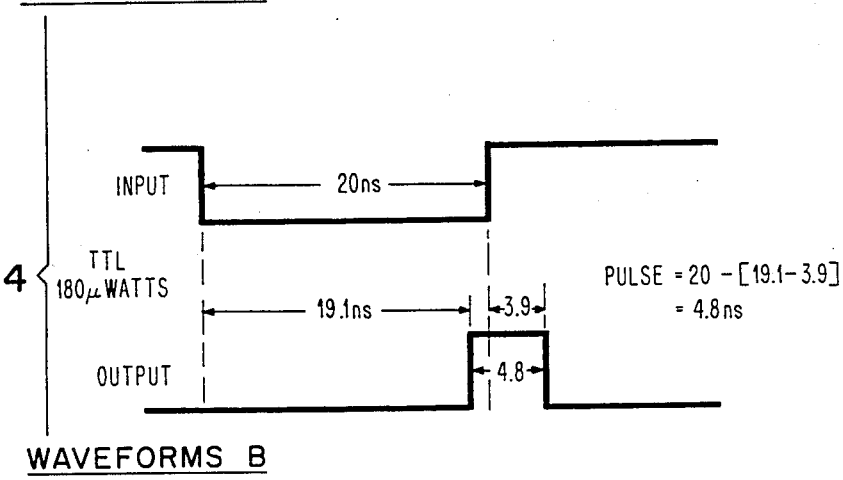
WAVEFORMS B
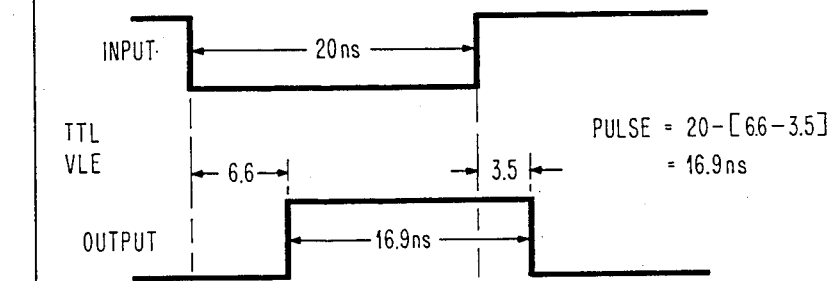
WAVEFORMS C

INTEGRATED CIRCUIT CHIP STRUCTURE WIRING AND CIRCUITRY FOR DRIVING HIGHLY CAPACITIVE ON CHIP WIRING NETS

FIELD OF THE INVENTION

The invention concerns an integrated circuit chip structure containing a plurality of integrated circuits and a plurality of wiring nets interconnecting said integrated circuit chips. At least one of said wiring nets being subjected to unduly high capacitive loading. A compensating circuit is connected to the unduly high capacitively loaded wiring net to obviate, or at least reduce, the detrimental effects on electrical performance resulting from the unduly high capacitance.

RELATED APPLICATIONS

U.S. patent application Ser. No. 452,541 entitled "TTL Logic Circuit" filed Dec. 23, 1982 by R. J. Blumberg, S. Brenner and R. Robortaccio and of common assignee herewith, granted as U.S. Pat. No. 4,521,700 on June 4, 1985.

U.S. patent application Ser. No. 625,426 entitled "Improved Gate Array Chip" by E. F. Culican et al, filed June 28, 1984 and of common assignee herewith granted as U.S. Pat. No. 4,613,958 on Sept. 23, 1986.

BACKGROUND OF THE INVENTION AND PRIOR ART

The prior art has addressed the problem of highly capacitive wiring nets by employing push-pull outputs and/or higher power circuits. The push-pull circuit requires more components and more silicon area on the chip.

The prior art includes numerous patents and publications directed to integrated circuit structure, wiring and circuitry for improving the operation of integrated circuitry contained on a semiconductor chip.

The following prior art patents and publications are directed to integrated circuit chip structure, circuitry and wiring. It is to be appreciated, that the following art is not necessarily the only, the best, or the most pertinent prior art.

PATENTS

U.S. Pat. No. 3,488,564 entitled "Planar Epitaxial Resistors" granted Jan. 6, 1970 to H. S. Crafts.

U.S. Pat. No. 3,513,365 entitled "Field-Effect Integrated Circuit and Method of Fabrication" granted May 19, 1970 to M. W. Levi.

U.S. Pat. No. 3,562,547 entitled "Protection Diode for Integrated Circuit" granted Feb. 9, 1971 to G. D. Brode et al and of common assignee herewith.

U.S. Pat. No. 3,534,236 entitled "Semiconductor Integrated Circuit Structure" granted Oct. 13, 1970 to K. E. Bean et al.

U.S. Pat. No. 3,610,951 entitled "Dynamic Shift Register" granted Oct. 5, 1971 to R. E. Howland.

U.S. Pat. No. 3,631,309 entitled "Integrated Circuit Bipolar Memory Cell" granted Dec. 28, 1971 to C. F. Myers.

U.S. Pat. No. 3,656,004 entitled "Bipolar Capacitor Driver" granted Apr. 11, 1972 to D. W. Kemer and of common assignee herewith.

U.S. Pat. No. 4,000,429 entitled "Semiconductor Circuit Device" granted Dec. 28, 1976 to K. Yoshida et al.

U.S. Pat. No. 4,200,811 entitled "Frequency Divider Circuit" granted Apr. 29, 1980 to A. R. Balaban et al.

U.S. Pat. No. 4,249,193 entitled "LSI Semiconductor Device and Fabrication Thereof" granted February 1981 to John Balyoz et al and of common assignee herewith.

U.S. Pat. No. 4,295,149 entitled "Master Image Chip Organization Technique or Method" granted Oct. 13, 1981 to John Balyoz et al and of common assignee herewith.

PUBLICATIONS

"Use of Emitter in an Unused Transistor as an Underpass" by D. S. Hershman, IBM TDB Vol. 14, No. 4, September 1971, page 1207.

"Integrated Delay Circuit" by H. Heimeier et al, IBM TDB, Vol. 21, No. 2, July 1978 pages 656–657.

"I.C.S. for Temperature Sensing and Control" by J. A. Morrison, Integrated Circuits, Vol. II, No. 20, Oct. 17, 1978.

SUMMARY OF THE INVENTION

The invention is directed to integrated circuit chips and particularly to "gate array", or "master slices" where on one or more circuits drive a highly capacitive on chip wiring net. As is well known in the art the driving of a highly capacitive on-chip wiring net is a burden which results in pulse delay and shrinkage. In accordance with the invention the driving circuits are modified and a compensation circuit coupled to the highly capacitive on-chip wiring net to mitigate the burden. Further, the invention includes integrated circuit structure to efficiently position on the chip a number of compensation circuits which are easily connected, as needed, during the fabrication of the chip. Also the employment of one, or a number of, on-chip compensation circuits does not materially increase the chip power consumption.

In VSLI, high capacitive loading of a wiring net must be addressed. As chips become larger and circuit density increases this problem intensifies. When an automatic wiring system wires the chip, it is frequently the situation that on the order of approximately 5% of the time a high capacitive wiring net will occur. A high capacitive wiring net causes the internal circuit to have a significant increase in signal delay, or pulse transmission. The disclosed technique, in accordance with the invention, will speed up these "problem" nets after the automatic wiring has been accomplished and without increasing the internal cell size.

The benefits of the invention may preferably be obtained by placing components of a "speed up" or compensation circuit in the silicon chip under a second level power bus. This integrated circuit chip location is particularly desirable in that frequently the silicon under the second level power buss is otherwise unused or blank. In general, a chip layout includes second level power buses which run the length of the chip. These power buses may be separated by a number, such as six to eight, of internal cells for power distribution.

Numerous "gate array" (or masterslice) layouts containing a sizeable number of wireable cells are known to art. A large number of U.S. Patents and publications are directed to "gate array" (or masterslice) layouts, cells containing components, wiring interconnecting components contained in a cell, first level metal conductors and second level metal conductors. U.S. Pat. No. 4,249,193 fully identified supra is directed to an improved master slice design technique including structure, wiring and method of fabricating very large scale integrated circuit devices. The specification of U.S. Pat. No. 4,249,193 is wholly incorporated herein by reference thereto, and to the same extent as though it were set forth herein word for word.

The primary object of the invention is to provide an improved integrated circuit chip.

A further object of the invention is to provide circuitry which compensates for the impaired electrical performance in integrated circuitry employing heavily capacitive wiring nets.

A further object of the invention is to provide in an integrated circuit chip fabricated as a part number from a gate array, circuitry and structure for off-setting the impaired, or diminished, performance of the integrated circuitry due to heavily capacitive wiring nets.

A further object of the invention is to provide compensating circuitry for TTL circuits called upon to drive a wiring net subjected to high capacitive loading.

The foregoing and other objects, features and advantages of the invention will be more apparent from the following more particular description of the preferred embodiment of the invention, as illustrated in the accompanying drawings.

BRIEF DESCRIPTION OF THE DRAWINGS

FIG. 1D discloses a DTL circuit which may be employed in the practice of the invention.

FIGS. 2A through 2D respectively further disclose a compensating (or speed-up) circuit employed in accordance with the practice of applicants' invention.

FIG. 4 discloses illustrative waveforms A, B, C referred to hereinafter in the detailed explanation of the invention. Waveforms A depict an ideal condition wherein an input pulse and an output pulse are of equal duration and the delay between the input and output pulse is relatively short. In waveforms B the pulse shrinkage (reduction in duration) and time delay between the input pulse and output pulse are very troublesome and pronounced if not totally unacceptable. Waveforms B illustrate the burden incurred, in the absence of the practice of applicants invention, where a relatively highly capacitive on chip wiring net must be driven. Waveforms C illustrate the benefits resulting from the practice of applicants' invention, where a highly capacitive on-chip wiring net must be driven. In waveforms C, it is seen that the "ideal" condition depicted by waveforms A is approached. Alternatively stated, the excessive delay and pulse shrinkage depicted by waveforms B is obviated or at least materially mitigated.

FIG. 5 illustrates an embodiment of the invention wherein the driving TTL circuit(s) and the driven TTL circuit are depicted as well as the interconnecting highly capacitive wiring net (first level metal) and a compensation circuit. Also illustrated is the placement of the compensation circuit beneath a second level metal power bus.

DETAILED DESCRIPTION OF THE INVENTION AND PREFERRED EMBODIMENT

Figure 1A:
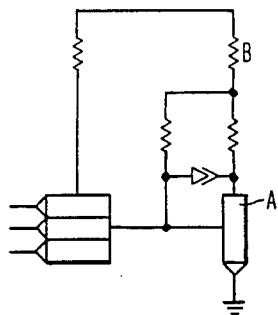
FIG. 1A discloses a TTL circuit which may be employed in the practice of the invention. The TTL circuit of FIG. 1A is fully disclosed and claimed in U.S. patent application Ser. No. 452,541, entitled "TTL Logic Circuits" filed Dec. 23, 1982, granted as U.S. Pat. No. 4,521,700 on June 4, 1985.
Figure 2A:
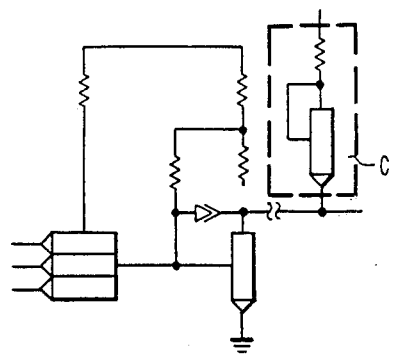
FIG. 2A discloses the TTL circuit of FIG. 1A modified in accordance with the invention.
Figure 1B:
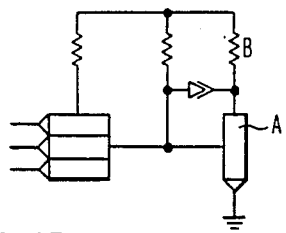
FIG. 1B discloses a well known TTL circuit which may be employed in the practice of the invention.
Figure 2B:
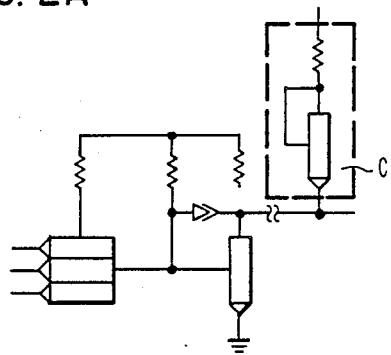
FIG. 2B discloses the TTL circuit of FIG. 1B modified in accordance with the invention.
Figure 1C:
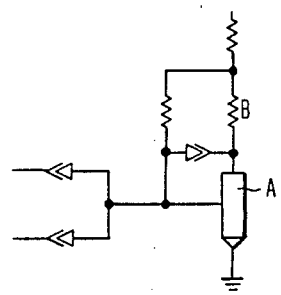
FIG. 1C discloses a DTL circuit which may be employed in the practice of the invention.
Figure 2C:
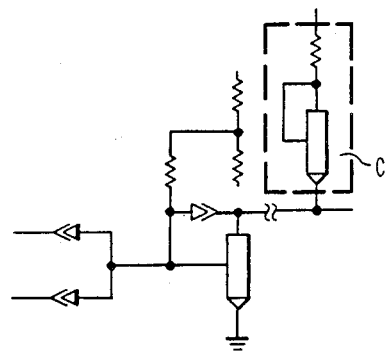
FIG. 2C discloses the DTL circuit of FIG. 1C modified in accordance with the invention.
Figure 2D:
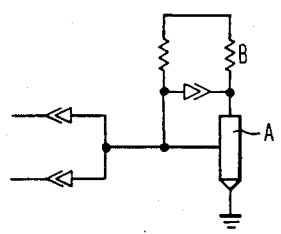
FIG. 2D discloses the DTL circuit of FIG. 1D modified in accordance with the invention.
Figure 2D:
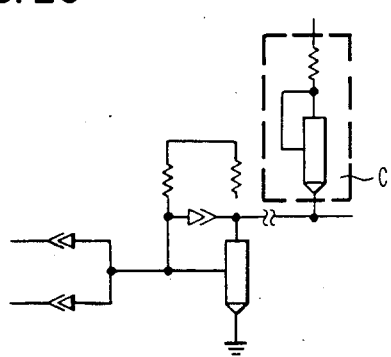

As chips become larger and the interconnections between gates becomes more complex, the occurrence of high capacitive wiring nets increases. The TTL circuit family has a weakness at high capacitive loading which is intensified as circuit power is lowered. The problem is seen in the rising transition of the output. The delay (when heavily loaded) is greatly determined by an RC time constant. The circuitry in accordance with the invention will provide a much lower RC time constant for the high capacitive nets. This "limited" use of circuit modification including a speed-up circuit solves the loading problem while adding minimal power to the overall chip requirement. For example, a TTL circuit operating with a power of 180 micro watts may have a 19 nano second $T_{off}$ (rising output) delay. This compares with a 6.6 nano second delay for the circuit as modified in accordance with the invention. FIG. 1A is in accordance with the prior art. FIG. 2A is in accordance with the invention.

Another critical aspect of circuit performance is pulse shrinkage. The ideal case is when both edges ($T_{on}$, $T_{off}$) have the same delay. The waveforms of FIG. 4 illustrate pulse delay and pulse shrinkage for ideal circuitry, for circuitry in accordance with the prior art, and for circuitry in accordance with the invention. Waveforms A illustrate the ideal case where a 20 ns input pulse yields a 20 ns output pulse. Waveforms B illustrate the case of a TTL circuit loaded with a highly capacitive output wiring net. Since the delay of the leading edge is much longer than the trailing edge, very significant pulse shrinkage occurs. In the illustrative example, a 20 ns input pulse is transformed into a 4.8 ns output pulse. Waveforms C illustrate the case of a TTL circuit loaded with a highly capacitive output net and modified in accordance with the invention. From waveforms C it is seen that an input pulse of 20 nanosecond results in an output pulse of 16.9 nanoseconds. It is apparent that the circuitry in accordance with the invention is very effective in minimizing the skew between the input and output pulses.

Figure 7:
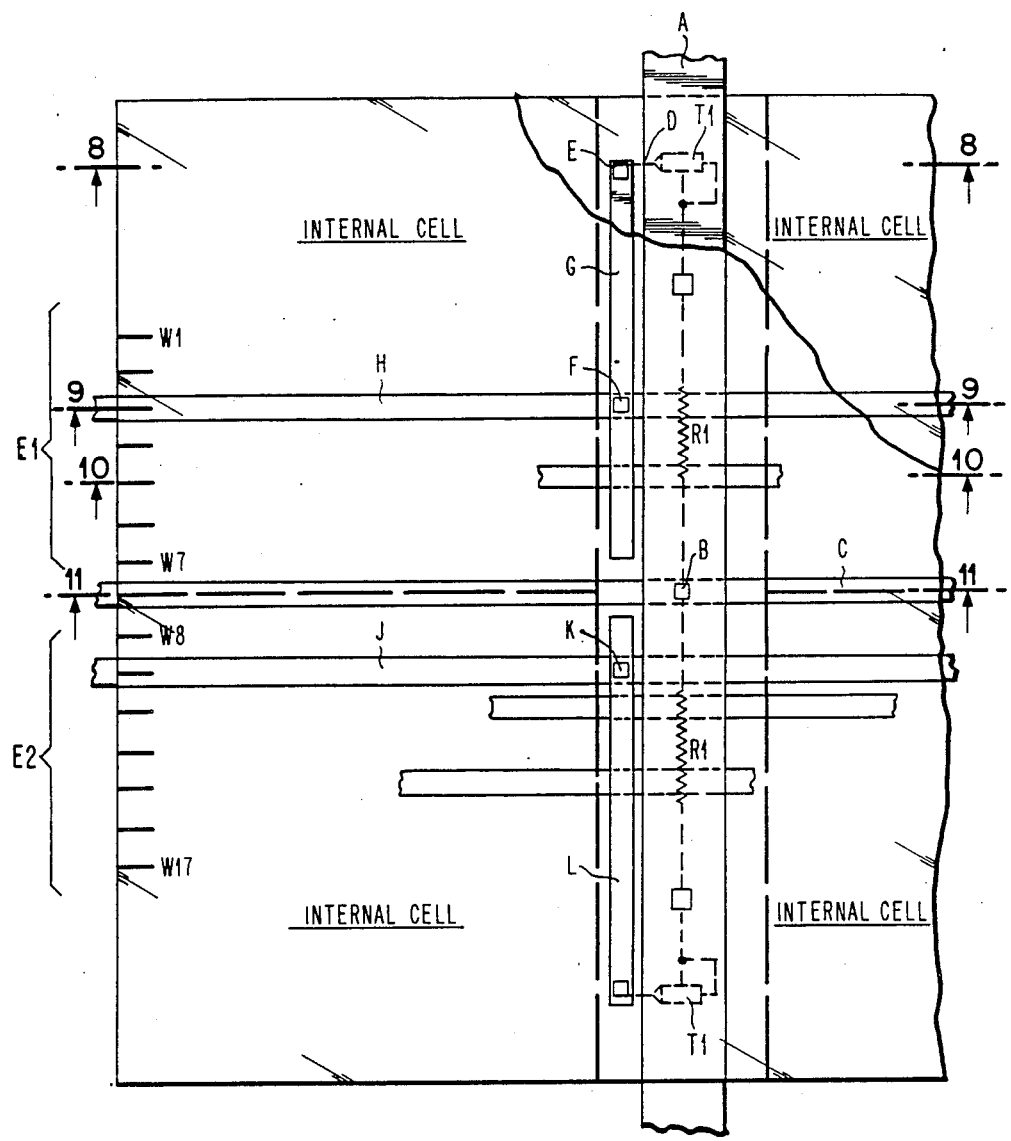
FIG. 7 is a further view of a portion of an integrated circuit chip, such as depicted in FIG. 2 and in accordance with the invention.
Figure 8:
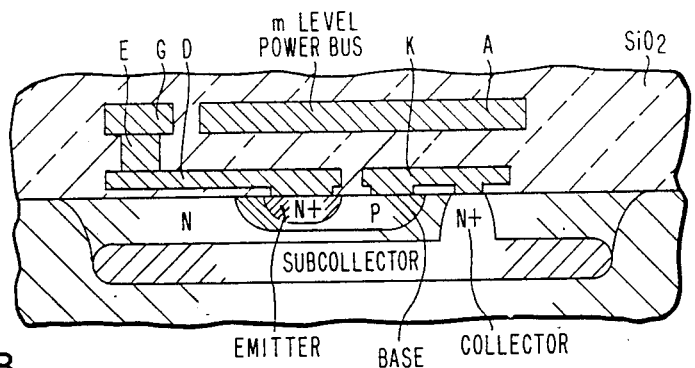
FIG. 8 is a cross-sectional view taken along the lines 8—8 of FIG. 7.
Figure 9:
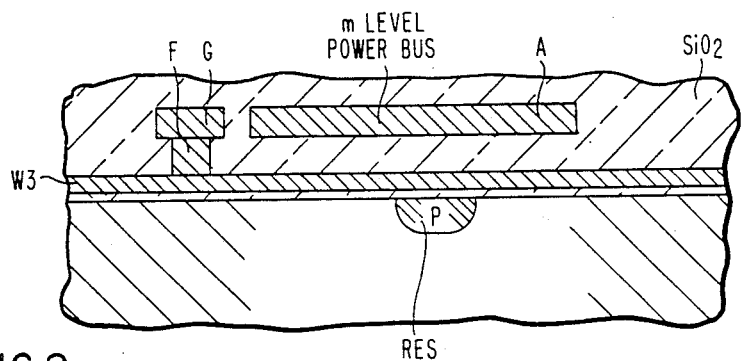
FIG. 9 is a cross-sectional view taken along the lines 9—9 of FIG. 7.
Figure 10:
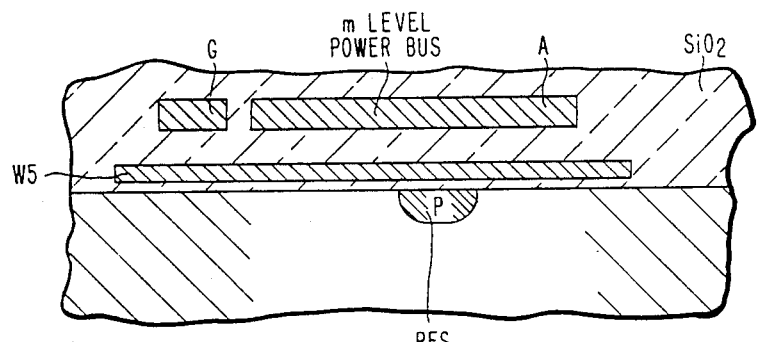
FIG. 10 is a cross-sectional view taken along the lines 10—10 of FIG. 7.
Figure 11:
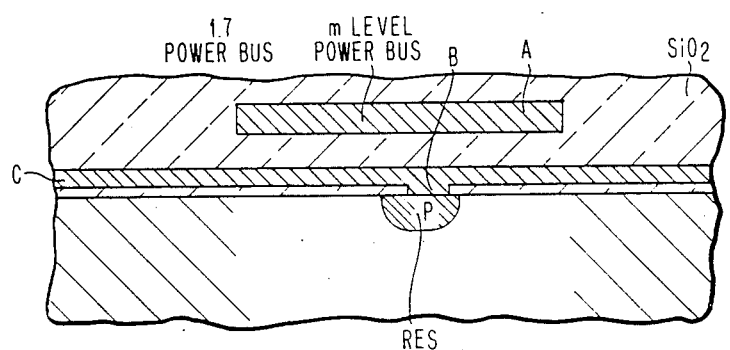
FIG. 11 is a cross-sectional view taken along the lines 11—11 of FIG. 7.

To be an effective solution the circuitry added and modified in accordance with the practice of the invention must be easily implemented and have minimal impact on chip size. The additional circuitry does not make a demand on chip silicon space since the circuit components thereof may be placed in chip silicon under a second metal power bus. (In many, if not most, gate array chips the silicon area under a second level metal bus is not utilized for cells or in any manner.) When the automatic wiring system generates a highly capacitive wiring net, for example 5 pf, the additional circuitry may be implemented by omitting a contact and placing a via; no rewiring is necessary. As will be fully apparent from the further description hereinafter (with detailed reference to the drawings) to generate a large capacitance a considerable amount of first level metal is required. For a brief overall understanding of the invention at this point the explanation will be limited to FIG. 7. FIG. 7 shows four internal cells (two by two) separated by a vertically extending second level metal power buss. There are two speed-up, or compensation, circuits shown in the drawing. FIG. 7 also illustrates the physical placement and components (T1, R1) of each of the speed circuits.

Figure 3:
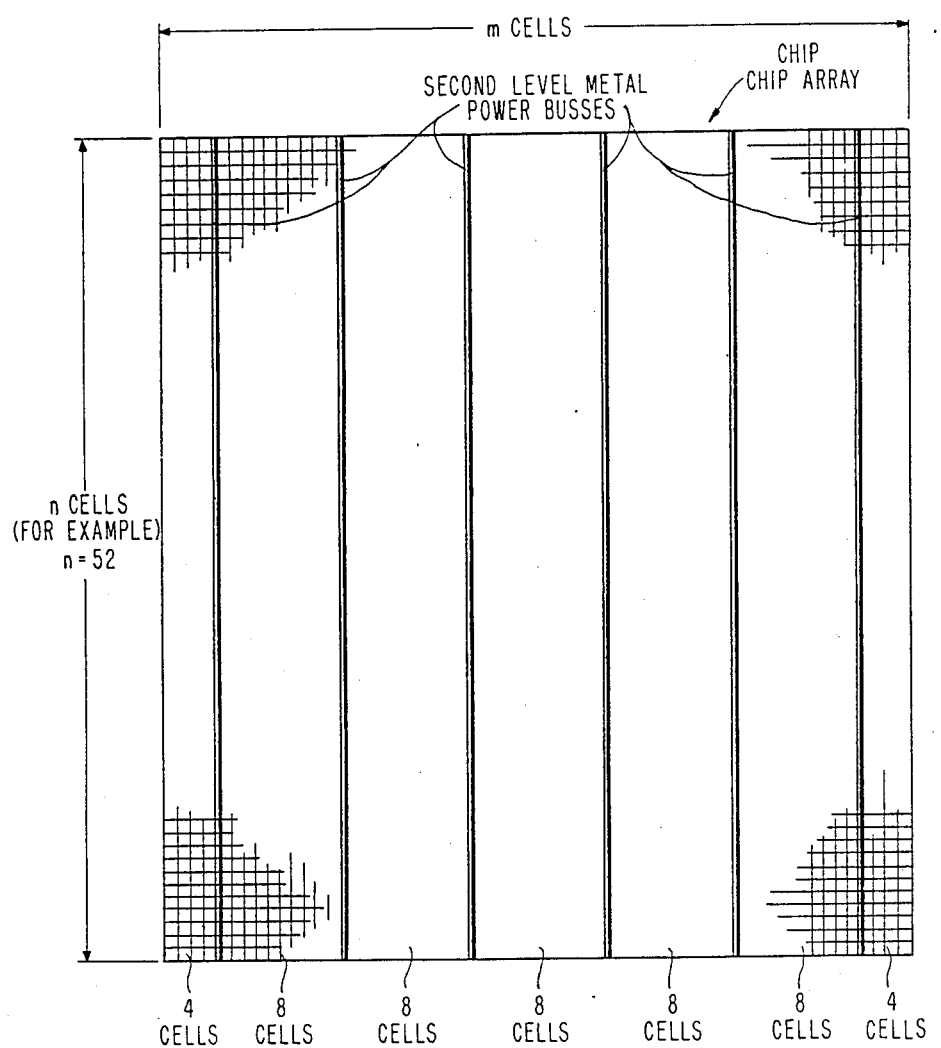
FIG. 3 depicts an integrated circuit (masterslice, or gate array) chip having an array of cells of m columns and n rows whereby the chip has m×n cells. As further depicted in FIG. 3, each row of cells has insulated therefrom and superimposed thereover a first level metal wiring channel. Each wiring channel comprises a plurality of first level metal conductors. Also represented in FIG. 3 are a plurality of spaced apart second metal power busses. The second level metal power busses are superimposed over and insulated from the first level metal wiring channels.

The components for the speed-up circuits (T1 & R1) are located under the second metal level power buss (A), which minimizes the space required to use the compensation circuit. The resistor end of the compensation circuit (B) is automatically connected to the power supply on first metal level conductor (C). The emitter end of the circuit (D) is connected to a second metal level wiring tab (G) which runs parallel to the second metal level power buss (A) crossing over all wiring channels (E1 or E2) in that row of internal cells. The circuit is connected by placing a via (F) between the second metal level wiring tab (G) and a high capacitive first metal level conductor line (H) crossing under it. FIG. 7 shows two rows of internal cells and their corresponding speed-up circuits. FIG. 7 discloses a small portion of FIG. 3. FIG. 3 illustrates second level metal power bussing on a gate array (or masterslice) chip. FIG. 3, for purposes of illustration, shows an internal matrix of 48×52 cells with six second level metal vertical power busses. This would allow 312 (6×52) speed-up circuits.

With the tendency to increase chip size and lower circuit power the problem of high capacitive nets has become a major concern. The practice of the disclosed invention provides an effective solution (with minimal impact on the automatic wiring system, chip size, and chip power) to the problem and burden of driving highly capacitive on chip wiring nets.

Figure 12:
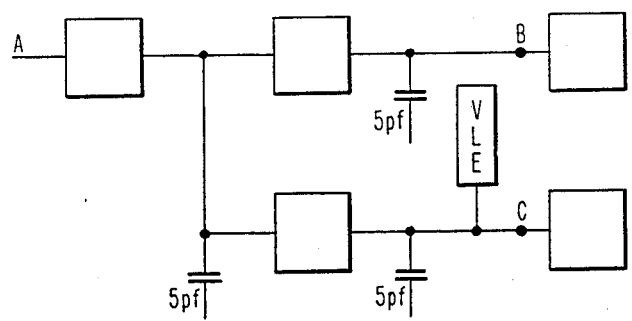
FIG. 12 is a circuit block diagram referred to in the explanation of the waveforms of FIG. 13.
Figure 13:
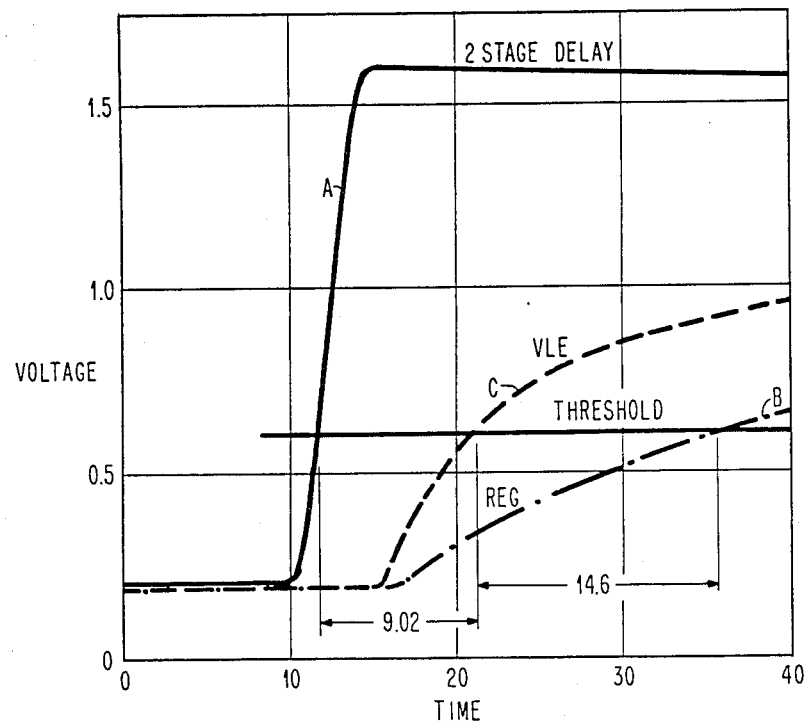
FIG. 13 discloses waveforms illustrative of the operation of the invention, as contrasted to waveforms of the prior art. In the explanation of the waveforms set-forth hereinafter reference is made to the circuit block diagram of FIG. 12.

FIGS. 1A–1D show various types (TTL and DTL) of logic circuits. These circuits have a problem as circuit power is reduced because the falling and rising output transitions have different sensitivities to capacitive loading. During the falling transition the output transistor (A) is turned on yielding a low impedance path to ground. During the rising transition the RC time constant of the collector resistor (B) determines the speed. This RC time constant is increased more and more as the need for lower power circuits arise. Because of this transition speed "skew" problem a major concern is pulse shrinkage. FIG. 4 illustrates this problem by means of some timing diagrams. Waveforms A represent the ideal case where the rising and falling delay are equal. If this were true the pulse output would always equal the input pulse. Waveforms B illustrate what happens with a real circuit loaded with 5 picofarads. The rising output delays is 19.1 ns while the falling output delay is 3.9 ns yielding a pulse shrinkage of 15.2 ns. The compensating circuit reduces the effect of the load capacitance on the rising output in order to alleviate this "skew" problem. FIGS. 2A through 2D respectively show a compensating circuit used in conjunction with the circuits shown in FIGS. 1A through 1D. The compensating circuit components (c) offer the rising transition a much lower impedance path to the power supply. The improvement in capacitive sensitivity can be seen in FIGS. 12 and 13. FIG. 12 illustrates how the waveforms were generated across 2 stages each being loaded to 5 picofarads. Waveform A in FIG. 13 represents the input, and waveforms B and C represent the TTL output and the compensated TTL circuit output, respectively. This illustration clearly shows that the effect of the large capacitance has been significantly reduced with the compensating circuit FIG. 4 waveforms C illustrate how the delay improvement has alleviated the pulse shrinkage problem. Although the rising output delay (6.6 ns) is still slower than the falling output delay (3.5 ns) the pulse shrinkage has been reduced to 3.1 ns as opposed to the previous 15.2 ns. This significant improvement is primarily achieved because the compensating circuit speeds up the slower transition (rising output) a great deal and effects the other transition minimally.

FIG. 3 depicts a generalized chip structure which contains 52 vertical and 48 horizontal cells. For power distribution power busses are placed at some fixed increment which is 8 cells for this example. There is one compensating circuit for each power bus in each cell height. This results in 52×6 compensating circuits. It can be clearly seen that any wire having a large capacitance would have a high probability of passing under one of the power busses shown in FIG. 3. FIG. 7 shows where a compensating circuit is placed and how it is connected. The components are placed under the second level metal power bus (A). A piece of first level metal (D) is used to connect the emitter to the via (a first metal level to second metel level connection) (E). A piece of second metal (G) makes a connection to the via (E) and crosses over all the first level metal wiring channels (W1–W7). If one of the first level wiring channels has a large capacitive net, a via F can be placed connecting the compensating circuit to the desired line. FIGS. 8–11 are cross sectional views, respectively taken along the lines 8—8, 9—9. 10—10 and 11—11 of FIG. 7 to clarify the illustration.

Figure 5:
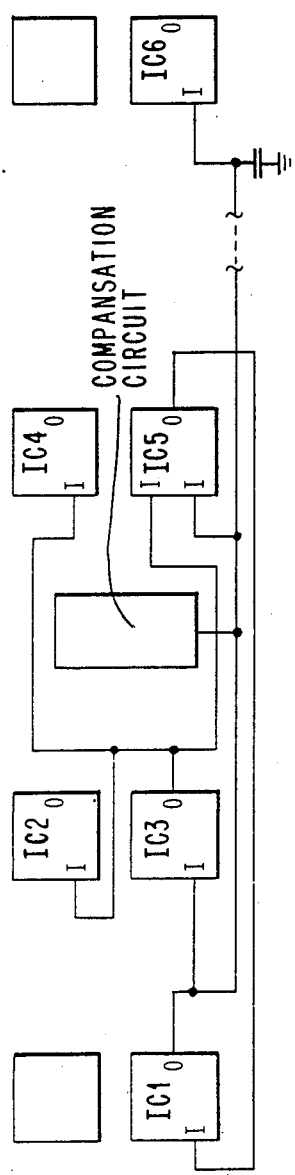
FIG. 5 is a circuit schematic, in accordance with the invention, and corresponding to the structure and circuitry of FIG. 6 concentrating on the particular net of interest.
Figure 6:
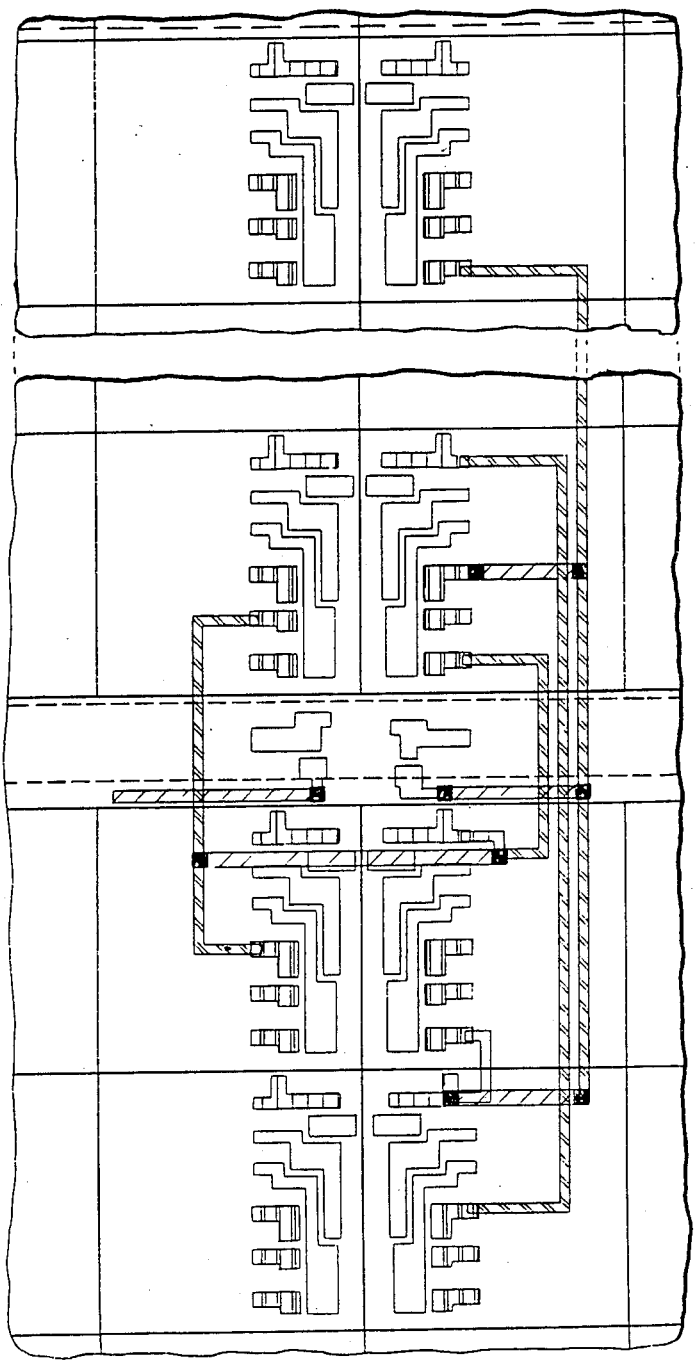
FIG. 6 is a planar view of a portion of an integrated circuit chip, such as depicted in FIG. 3 and in accordance with the invention.

FIG. 5 is an example of TTL logic circuit connections (no particular function) and how a compensating circuit is employed. In FIG. 5 the driving and driven integrated TTL logic circuits are labelled IC1 through IC6 and the compensation circuit is also represented by a labelled box. In conjunction with the logic diagram of FIG. 5 a chip layout is shown in FIG. 6. Solid black squares depict first to second level connections (vias). This illustration, FIG. 6, shows the interconnection of a compensating circuit on an actual chip layout.

Although the invention has been described with a certain degree of particularity, it is understood that the present disclosure has been made only by way of example and that numerous changes may be made without departing from the spirit and scope of the invention.

What is claimed is:

1. In an integrated circuit semiconductor chip, said integrated circuit semiconductor chip comprising:
    at least n integrated circuits formed in said semiconductor chip, where n is a positive integer greater than one, each of said n integrated circuits having at least one input and an output;
    at least one additional integrated circuit, said one additional integrated circuit having at least one input and an output, said at least one input of said at least one additional integrated circuit being spaced from said outputs of said n integrated circuits;
    a plurality of spaced apart first level metal conductors contained on said integrated circuit chip, said plurality of spaced apart first level metal conductors being insulated from and superimposed over said integrated circuits contained on said integrated circuit chip, said plurality of spaced apart first level metal conductors each extending in a first direction;
    a plurality of spaced apart second level metal conductors contained on said integrated circuit chip and connected to a power supply, said plurality of spaced apart second level metal conductors being insulated from and superimposed over said plurality of spaced apart first level metal conductors, said plurality of spaced apart second level metal conductors each extending in a direction at an angle to said first direction of said plurality of spaced apart first level metal conductors;
    a wiring net contained on said chip and interconnecting a plurality of said n outputs of said n integrated circuits and said at least one input of said additional integrated circuit, said wiring net including one of said first level metal conductors, said wiring net possessing an unduly large magnitude of capacitance, said unduly large magnitude of the capacitance of said wiring net having a detrimental effect on the electrical characteristics of a pulse transmitted from the output of one or more of said n integrated circuits to said at least one input of said additional integrated circuit; and
    a compensation circuit for materially mitigating the detrimental effect of the unduly large magnitude of the capacitance of said wiring net, said compensation circuit connected between said wiring net and a predetermined one of
    said spaced apart second level metal conductors, said compensation circuit consisting essentially of a serially connected resistor and a diode, for providing current from said second level conductor directly to said wiring net.

2. An integrated circuit chip, comprising:
    a plurality of integrated circuits formed in said semiconductor chip;
    a first plurality of spaced apart insulated conductor nets substantially at a first level above said semiconductor chip for interconnecting a plurality of said integrated circuits;
    a power supply;
    a plurality of spaced apart insulated conductors at a second level above said semiconductor chip different from said first level, said second level conductors extending in substantially a first direction, said second level conductors connected to said power supply and to said integrated circuits to provide power thereto;
    a plurality of unconnected compensation means formed in said semiconductor chip, each of said compensation means disposed in said chip adjacent to a different one of a second plurality of said conductor nets, said compensation means for providing a low impedance path, when connected, between said power supply and said ones of said conductor nets; and
    means for connecting at least two of said conductor nets which have compensation means associated therewith and which have unduly large capacitance values directly to said power supply through their associated compensation means to thereby mitigate the detrimental effect of unduly large capacitance on said selected conductor nets.

3. An integrated circuit chip as defined in claim 2, wherein said compensation means are formed in rows in the semiconductor area of said semiconductor chip directly below selected ones of said spaced apart second level conductors.

4. An integrated circuit chip as defined in claim 3, wherein said insulated conductor nets are disposed directly over said integrated circuits formed in said semiconductor chip, and wherein said second level conductors are insulated from but disposed on a level directly over said spaced apart conductor nets.

5. An integrated circuit chip as defined in claim 2, wherein each of said compensation means consists essentially of resistance means and a diode connected in series, for supplying current, when connected, from said power supply 6. An integrated circuit chip, comprising:
    a plurality of integrated circuits formed in said semiconductor chip;
    a plurality of spaced apart insulated conductor nets disposed on at least one level above said semiconductor chip for interconnecting said integrated circuits;
    a power supply;
    a plurality of spaced apart insulated power conductors connected to said power supply and disposed at a given level above said semiconductor chip and extending in substantially a first direction;
    a first plurality of unconnected net-capacitance compensation circuits disposed in a plurality of rows, each of said rows being substantially disposed under and aligned with a different respective power conductor in said plurality of power conductors, with a given net capacitance compensation circuit, when connected, providing a low impedance path between said power supply and a selected conductor net to reduce the effect of capacitance on said conductor net; and means for connecting at least two of said conductor nets directly to said power supply through different net capacitance compensation circuits to thereby mitigate the effect of unduly large capacitance on said selected conductor nets.

7. An integrated circuit as defined in claim 6, wherein each of said compensation circuits includes means for maintaining its respective conductor net at least one diode voltage drop below the voltage of said power supply.

8. An integrated circuit chip and defined in claim 6, wherein each of said compensation circuits consist essentially of resistance means and a diode connected in series for supplying current, when connected, from said power supply directly to a selected conductor net.

* * * * *